United States Patent
Zhen et al.

(10) Patent No.: US 8,755,544 B2
(45) Date of Patent: Jun. 17, 2014

(54) EARPHONE POWER AMPLIFIER, WORKING METHOD, AND MOBILE TERMINAL EQUIPMENT

(71) Applicant: Huawei Device Co.,Ltd., Shenzhen (CN)

(72) Inventors: Haitao Zhen, Wuhan (CN); Yongxiang Yang, Wuhan (CN); Xuxing Yan, Wuhan (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/648,761

(22) Filed: Oct. 10, 2012

(65) Prior Publication Data
US 2013/0223659 A1 Aug. 29, 2013

(30) Foreign Application Priority Data
Feb. 27, 2012 (CN) .......................... 2012 1 0045902

(51) Int. Cl.
*H04R 5/02* (2006.01)
(52) U.S. Cl.
USPC ........... 381/309; 381/74; 381/94.5; 381/94.6; 330/260; 330/4.8
(58) Field of Classification Search
USPC ........... 381/123, 120, 121, 101, 102, 28, 1, 2, 381/13, 17, 18, 307, 309, 311, 55, 322, 329, 381/72, 74, 332, 334, 94.5, 94.6, 103, 366, 381/370, 124; 700/94; 330/260, 261, 262, 330/265, 267, 268, 271, 282, 291, 75, 78, 330/82, 85, 83, 96, 99, 101, 104, 108, 112; 455/295, 550.1; 379/431, 55.1, 22.07, 379/22.01, 388.07, 292, 417
See application file for complete search history.

(56) References Cited

U.S. PATENT DOCUMENTS 6,433,635 B2 * 8/2002 Watanabe ..................... 330/253
7,558,607 B2 7/2009 Edeler et al.
(Continued)

FOREIGN PATENT DOCUMENTS

| CN | 201069882 Y | 6/2008 |
|---|---|---|
| CN | 101316111 A | 12/2008 |
| CN | 101489165 A | 7/2009 |

OTHER PUBLICATIONS

Written Opinion of the International Searching Authority issued in corresponding PCT Patent Application No. PCT/CN2012/077492, mailed Nov. 29, 2012.

(Continued)

*Primary Examiner* — Leshui Zhang
(74) *Attorney, Agent, or Firm* — Brinks Gilson & Lione (57) ABSTRACT

The present disclosure provides an earphone power amplifier, including a ground contact connected to a ground wire of an earphone, a left sound channel power amplifying circuit connected to a left sound channel of the earphone, and a right sound channel power amplifying circuit connected to a right sound channel of the earphone. The left sound channel power amplifying circuit includes a first operational amplifier and a first positive feedback exported from an input end of the first ferrite bead to an in-phase input end of the first operational amplifier, the right sound channel power amplifying circuit includes a second operational amplifier and a second positive feedback exported from the input end of the first ferrite bead to an in-phase input end of the second operational amplifier.

7 Claims, 4 Drawing Sheets

(56) References Cited

U.S. PATENT DOCUMENTS

| | | | |
|---|---|---|---|
| 2006/0223570 A1* | 10/2006 | Zhu et al. | 455/550.1 |
| 2009/0262970 A1* | 10/2009 | Shin et al. | 381/384 |
| 2009/0325633 A1 | 12/2009 | Koerner et al. | |
| 2011/0268289 A1* | 11/2011 | Baranwal et al. | 381/74 |

OTHER PUBLICATIONS

International Search Report issued in corresponding PCT Patent Application No. PCT/CN2012/077492, mailed Nov. 29, 2012.

Extended European Search Report issued in corresponding European Patent Application No. 12186830.1, mailed Jun. 7, 2013, 7 pages.

* cited by examiner

EARPHONE POWER AMPLIFIER, WORKING METHOD, AND MOBILE TERMINAL EQUIPMENT

CROSS-REFERENCE TO RELATED APPLICATIONS

This application claims priority to Chinese Patent Application No. 201210045902.8, filed on Feb. 27, 2012, entitled "Earphone power amplifier, working method, and mobile terminal equipment," which is hereby incorporated by reference in its entirety.

FIELD

The present disclosure relates to electronic technologies, and in particular, to an earphone power amplifier (PA), a working method, and a mobile terminal equipment.

BACKGROUND

Figure 1:
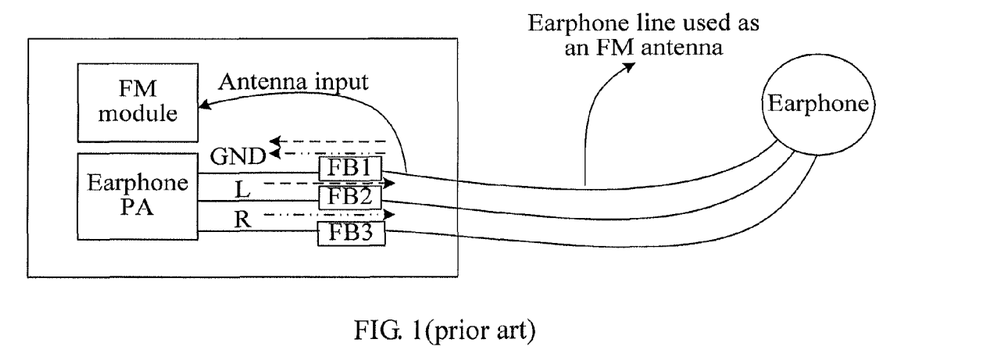
FIG. 1 is a schematic diagram of a connection relationship between an earphone and an FM device of a terminal equipment in the prior art.

With the increasing enrichment of terminal equipments in the market, many terminal equipments are equipped with frequency modulation (FM) devices. Under normal circumstances, an antenna of FM is rather long, and a terminal equipment does not provide an antenna especially for an FM device, so a method using an earphone as an FM device antenna is proposed. FIG. 1 is a schematic diagram of a connection relationship between an earphone and an FM device of a terminal equipment in the prior art. To prevent attenuation of an FM signal at an earphone connector, an FM ferrite bead (FB) needs to be serially connected to left and right sound channels and a ground wire of the earphone, so as to isolate the FM signal and ensure sensitivity of the FM device in the terminal equipment.

However, because the ground wire of the earphone is serially connected to the FM ferrite bead, signal backflows of the left and the right sound channels both pass the FM ferrite bead on the ground wire when music is played in the earphone. As a result, crosstalk is generated between the left and the right sound channels, a stereo crosstalk index turns bad, and a stereo effect of sound reproduction is badly affected.

SUMMARY

Embodiments of the present disclosure provide an earphone power amplifier, a working method, and a mobile terminal equipment, so as to reduce crosstalk between left and right sound channels.

In a first embodiment, a power amplifier includes a ground contact connected to a ground wire of an earphone, a left sound channel power amplifying circuit connected to a left sound channel of the earphone, and a right sound channel power amplifying circuit connected to a right sound channel of the earphone; where the left sound channel power amplifying circuit includes a first operational amplifier, the right sound channel power amplifying circuit includes a second operational amplifier; and the ground contact is serially connected to a first ferrite bead. The left sound channel power amplifying circuit further includes a first positive feedback exported from an input end of the first ferrite bead to an in-phase input end of the first operational amplifier, and the right sound channel power amplifying circuit further includes a second positive feedback exported from the input end of the first ferrite bead to an in-phase input end of the second operational amplifier.

In a second embodiment, a method based on the foregoing earphone power amplifier is disclosed. In the method, the left sound channel power amplifying circuit performs amplifying operation processing according to input signals input to the in-phase input end and an anti-phase input end and a first positive feedback signal input to the in-phase input end, and outputting a left sound channel signal to the left sound channel of the earphone. The right sound channel power amplifying circuit performs amplifying operation processing according to input signals input to the in-phase input end and an anti-phase input end and a second positive feedback signal input to the in-phase input end, and outputting a right sound channel signal to the right sound channel of the earphone. The first ferrite bead receives signals fed back from the left sound channel and the right sound channel of the earphone, and sending the fed back signals as the first positive feedback signal and the second positive feedback signal to the in-phase input end of the first operational amplifier and the in-phase input end of the second operational amplifier respectively.

A third embodiment provides a mobile terminal equipment. The mobile terminal includes: a frequency modulation (FM) device, an earphone, and an earphone power amplifier, where the earphone is configured to provide an antenna for the FM device, and the earphone power amplifier is as described above.

BRIEF DESCRIPTION OF THE DRAWINGS

To illustrate the solutions in the embodiments of the present disclosure more clearly, accompanying drawings required for describing the embodiments or the prior art are introduced briefly below. Apparently, the accompanying drawings in the following description are merely some illustrative embodiments of the present disclosure, and persons of ordinary skill in the art may further obtain other drawings according to these accompanying drawings without creative efforts.

DETAILED DESCRIPTION OF THE EMBODIMENTS

A few benefits of the present disclosure include: A positive feedback is imported to the left and the right sound channel power amplifiers of the earphone power amplifier, where the positive feedback is exported from the input end of the first ferrite bead serially connected to the ground contact of the earphone power amplifier, so that an input signal of the input end of the first ferrite bead is used as a reference of the left and the right sound channel power amplifiers, thereby effectively reducing the crosstalk between the left and the right sound channels.

Figure 2:
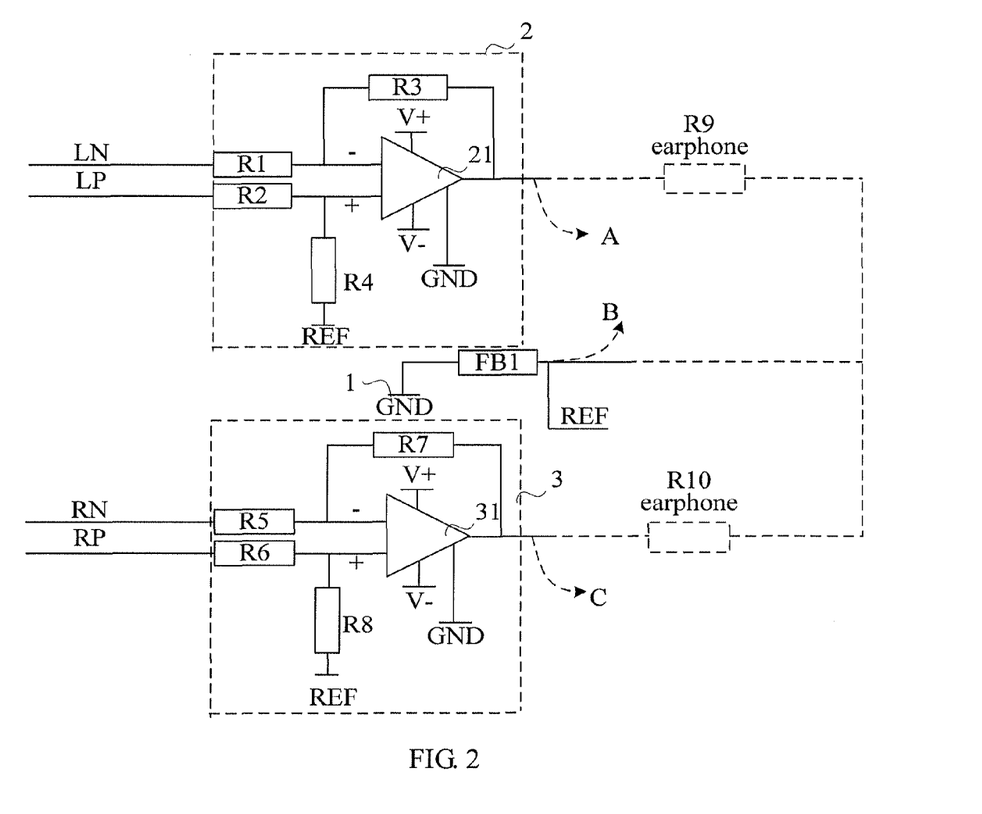
FIG. 2 is a schematic structural diagram of an earphone power amplifier according to a first embodiment of the present disclosure.
Figure 3:
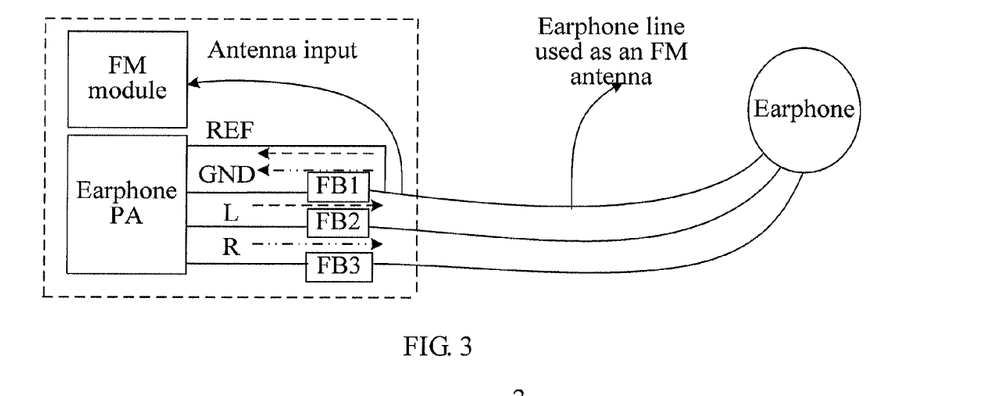
FIG. 3 is a schematic structural diagram of the earphone power amplifier shown in FIG. 2 being connected to an earphone.

FIG. 2 is a schematic structural diagram of an earphone power amplifier according to a first embodiment of the present disclosure, and FIG. 3 is a schematic structural diagram of the earphone power amplifier shown in FIG. 2 being connected to an earphone. As shown in FIG. 2, the earphone power amplifier may include: a ground contact GND1 connected to a ground wire of an earphone, a left sound channel power amplifying circuit 2 connected to a left sound channel of the earphone, and a right sound channel power amplifying circuit 3 connected to a right sound channel of the earphone. It should be noted that, in the first embodiment of the present disclosure, a most basic differential input operational amplifier is taken as an example to describe the left and the right sound channel power amplifying circuits (2 and 3), but specific circuit representation forms of the left and the right sound channel power amplifying circuits (2 and 3) are not limited, and other circuit forms that are similar to FIG. 2 and meet a requirement of the earphone power amplifier shall fall within the protection scope of the present disclosure.

In the following description, the left sound channel power amplifying circuit 2 is called a left power amplifier 2 for short, and the right sound channel power amplifying circuit 3 is called a right power amplifier 3 for short. The left power amplifier 2 includes a first operational amplifier 21, where the first operational amplifier 21 may include an in-phase input end (the terminal shown by + of 21 in FIG. 2), an anti-phase input end (the terminal shown by − of 21 in FIG. 2), and an output end (the terminal shown by point A of 21 in FIG. 2).

In this embodiment, the left power amplifier 2 receives a positive input signal of the left sound channel (Left Positive, LP) and a negative input signal of the left sound channel (Left Negative, LN), and outputs a left sound channel signal to the left sound channel of the earphone after performing processing on the received positive and negative input signals of the left sound channel. The right power amplifier 3 receives a positive input signal of the right sound channel (Right Positive, RP) and a negative input signal of the right sound channel (Right Negative, RN), and outputs a right sound channel signal to the right sound channel of the earphone after performing processing on the received positive and negative input signals of the right sound channel.

Similarly, the right power amplifier 3 includes a second operational amplifier 31, where the second operational amplifier 31 may include an in-phase input end (the terminal shown by + of 31 in FIG. 2), an anti-phase input end (the terminal shown by − of 31 in FIG. 2), and an output end (the terminal shown by point C of 31 in FIG. 2).

It should be noted that, in FIG. 2, the left power amplifier 2 further includes an R1, an R2, an R3, and an R4, and the right power amplifier 3 further includes an R5, an R6, an R7, and an R8. In the prior art, the R4 and the R8 are connected to the ground contact GND1, which is improved in the embodiments of the present disclosure, and the improvement is described later in the embodiments. Resistors of the R1 to the R8 are preferably of 10K ohm in the basic differential input operational amplifier shown in FIG. 2.

In this embodiment, the in-phase input end of the first operational amplifier 21 receives the positive input signal of the left sound channel (Left Positive, LP) through the R2, and the anti-phase input end receives the negative input signal of the left sound channel (Left Negative, LN) through the R1; the in-phase input end of the second operational amplifier 31 receives the positive input signal of the right sound channel (Right Positive, RP) through the R6, and the anti-phase input end receives the negative input signal of the right sound channel (Right Negative, RN) through the R5.

The ground contact GND1 is further serially connected to a first ferrite bead FB1, the output end of the first operational amplifier 21 is further serially connected to a second ferrite bead FB2. In this embodiment, the left sound channel signal output by the left power amplifier 2 is output to the left sound channel of the earphone through the FB2; the output end of the second operational amplifier 31 is further serially connected to a third ferrite bead FB3. In this embodiment, the right sound channel signal output by the right power amplifier 3 is output to the right sound channel of the earphone through the FB3, as shown in FIG. 3. A resistor R9 serially connected to the output end of the first operational amplifier 21 in a dashed line form is analog earphone impedance, and a resistor R10 serially connected to the output end of the second operational amplifier 31 in the dashed line form is analog earphone impedance. The analog earphone impedance is generally of 32 ohm in the prior art.

It should be emphasized that the left power amplifier 2 also has a first positive feedback exported from an input end of the first ferrite bead FB1 to the in-phase input end of the first operational amplifier 21. The right power amplifier 3 also has a second positive feedback exported from the input end of the first ferrite bead FB1 to the in-phase input end of the second operational amplifier 31. A concept of a positive feedback is illustrated as follows. The positive feedback may be understood as a process of feeding back partial output and input in phase to an output end to enlarge an amplification coefficient. That is to say, the positive feedback may be understood as a control manner, and it may specifically be implemented by many circuits. In this embodiment, a simplest one is applied, that is, an REF signal is imported to an in-phase input end through a resistor.

In this embodiment, the input end of the first ferrite bead FB1 receives signals fed back from the left sound channel and the right sound channel of the earphone, and sends the fed back signals as a first positive feedback signal and a second positive feedback signal to the in-phase input end of the first operational amplifier 21 and the in-phase input end of the second operational amplifier 31 respectively.

In this embodiment, the present disclosure is compared with the prior art (a feedback signal is not imported).

It may be seen from FIG. 2 that VL=VLP−VLN and VR=VRP−VRN.

The R1, the R2, the R3, the R4, the R5, the R6, the R7, and the R8 are all resistors of 10 k ohm, and the R9 and the R10 are the analog earphone impedance of 32 ohm.

To simplify the analysis, FB1 audio impedance RFB1 is calculated as 1 ohm.

A voltage of a signal of the left sound channel of an earphone side is represented by VAB, and a voltage of a signal of the right sound channel of the earphone side is represented by VCB.

A file having a sine wave in the left sound channel and having no sound in the right sound channel is played to perform a test.

In this case, VL is a sine wave having a frequency of 1 kHz and a peak value of 1 V, and VR is 0;

before modification, that is, in the prior art, it may be obtained that:

$VA=VL/R1*R3=1$ V;

$VB=VAPP*RFB1/(R9+RFB1)=1/33$ V;

$VC=0$ V $VAB=VA-VB=^{32}/_{33}\,V$;

$VCB=VC-VB=-^{1}/_{33}\,V$;

VCB is a product of crosstalk, and a corresponding stereo crosstalk (Stereo crosstalk) index is:

$20lg(VCB/VAB)=-30.1\,dB$.

In the present disclosure, because the first positive feedback and the second positive feedback are imported, an adder is formed in the left power amplifier 2 and the right power amplifier 3. With reference to FIG. 2, it may be known that:

a voltage VB of point B+an input voltage VL of the first operational amplifier 21=a voltage VA of point A; and the voltage VB of point B+an input voltage VR of the second operational amplifier 31=a voltage VC of point C.

Therefore, the voltage of the signal of the left sound channel of the earphone side is:

$VAB=VA-VB=VL$; and the voltage of the signal of the right sound channel of the earphone side is:

$VCB=VC-VB=VR$.

It is assumed that for the file having the sine wave (it is assumed that VL has the frequency of 1 kHz and the peak value of 1 V) in the left sound channel and having no sound (VR is 0) in the right sound channel: the voltage of the signal of the left sound channel of the earphone side is VAB=1 V, and the voltage of the signal of the right sound channel of the earphone side is VCB=0 V.

Compared the present disclosure with the prior art, in the present disclosure, VCB is of 0 V, that is, it may be considered that the crosstalk does not exist. Therefore, by adopting the solution provided in the present disclosure, a positive feedback is imported to the left and the right sound channel power amplifiers of the earphone power amplifier, where the positive feedback is exported from the input end of the first ferrite bead serially connected to the ground contact of the earphone power amplifier, so that an input signal of the input end of the first ferrite bead is used as a reference of the left and the right sound channel power amplifiers. That is to say, even though crosstalk in the input end of the first ferrite bead is large, crosstalk between the left and the right sound channels may also be effectively reduced.

Figure 4:
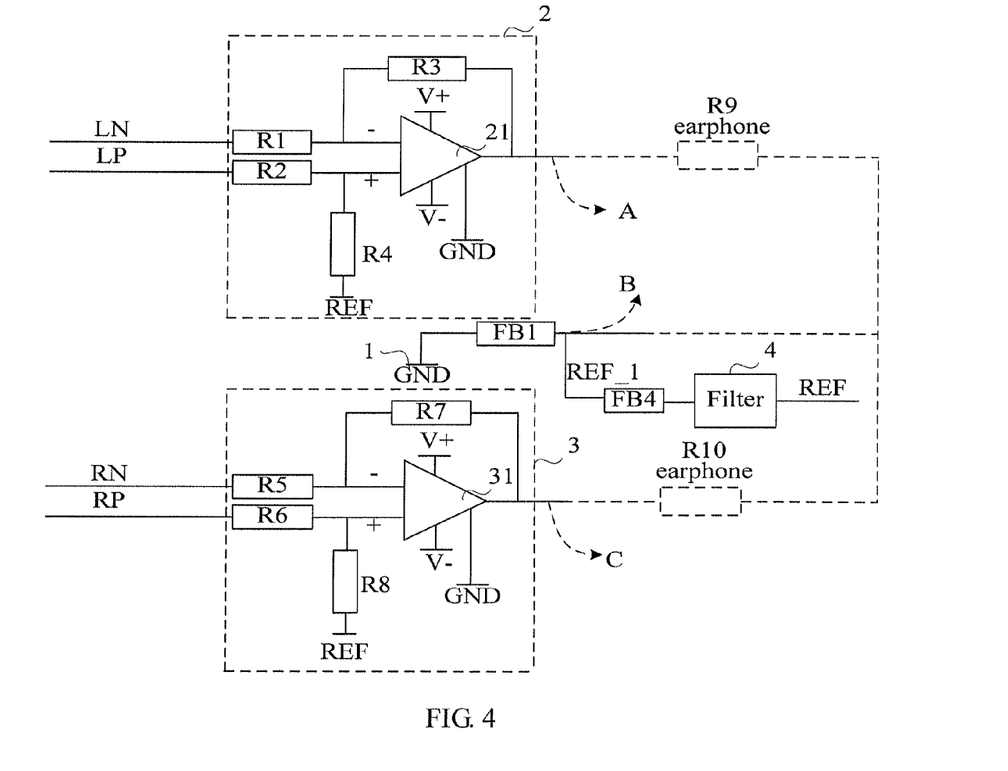
FIG. 4 is a schematic structural diagram of an earphone power amplifier according to a second embodiment of the present disclosure.

FIG. 4 is a schematic structural diagram of an earphone power amplifier according to a second embodiment of the present disclosure. Based on the foregoing embodiment, as shown in FIG. 4, the earphone power amplifier further includes: a filter 4. An input end of the filter 4 is connected to an input end of a first ferrite bead FB1. Correspondingly, a first positive feedback is exported from an output end of the filter 4 to an in-phase input end of a first operational amplifier 21, and a second positive feedback is exported from the output end of the filter 4 to an in-phase input end of a second operational amplifier 31.

For the improvement to such a circuit, it should be noted that, a bandwidth of an audio power amplifier is generally about 30 MHz, and impedance of a ferrite bead increases as a frequency increases, which causes that the first positive feedback and the second positive feedback become strong from a weak positive feedback to an extent that self-oscillation of the earphone power amplifier may be caused, thereby causing damage to the earphone power amplifier and an earphone. Therefore, the filter 4, preferably a low pass filter, may be added in the earphone power amplifier to perform attenuation on a signal having a high frequency, so as to effectively avoid the self-oscillation of the earphone power amplifier. The filter 4 preferably adopts a resistor-capacitor RC filter formed of a resistor of 120 ohm and a capacitor of 22 nF. Though the higher a cut-off frequency of the RC filter is, the smaller crosstalk is, possibility of the self-oscillation increases. Specific parameter setting may be manually or automatically adjusted according to a self-oscillation frequency of the earphone power amplifier, which is not limited here.

An example is illustrated as follows. If a TPA6132 is used as left and right sound channel power amplifiers, and there is no filter 4, it is found through a test that left and right power amplifiers are self-oscillated at a frequency of 2.5 MHz and cannot work normally, which may further cause over-power damage to the power amplifiers and the earphone. Therefore, the filter 4 is introduced to perform attenuation on a signal of 2.5 MHz to a great extent and basically not to perform attenuation on a signal within an audio frequency of 20 kHz, which effectively reduces the possibility of the self-oscillation.

However, after the foregoing filter is added, impedance of the first positive feedback and the second positive feedback to the ground may be caused to decrease, and a ferrite bead signal may be caused to attenuate. Therefore, a ferrite bead (a fourth ferrite bead FB4 in this embodiment) may be serially connected to the input end of the filter 4, so as to ensure that an FM antenna signal is not attenuated.

It should be further noted that, generally, it is easy for an earphone of a terminal equipment to receive a signal sent by a GSM, which causes a TDD noise; therefore, sometimes a radio frequency ferrite bead is serially connected to an interface of the earphone, direct current impedance and radio frequency impedance of the radio frequency ferrite bead are both higher than those of an FM ferrite bead, and the radio frequency ferrite bead has a small size and a low cost. Therefore, one or multiple of a first ferrite bead FB1, a second ferrite bead FB2, a third ferrite bead FB3 and a fourth ferrite bead FB4 may be replaced with the radio frequency ferrite bead disposed on the interface of the earphone, so as to reduce the cost and improve performance.

Through a set of data, the following gives a vivider description about that the earphone power amplifier provided in the embodiment of the present disclosure can improve the stereo crosstalk index. A mobile terminal equipment provided in the present disclosure is tested through RMAA and an index is as shown in Table 1 as follows:

TABLE 1

| Stereo crosstalk (Stereo crosstalk), dB | −70.3 | Good (Good) |

Table 2 shows a stereo crosstalk index obtained by testing, through the RMAA, a terminal equipment provided in the prior art as shown in FIG. 1 and mentioned in the background of the disclosure.

TABLE 2

| Stereo crosstalk (Stereo crosstalk), dB | −38.0 | Very poor (Very poor) |

Through a comparison between Table 1 and Table 2, it may be found that the solution provided in the embodiment of the present disclosure may effectively improve a stereo crosstalk index of a terminal equipment.

Figure 5:
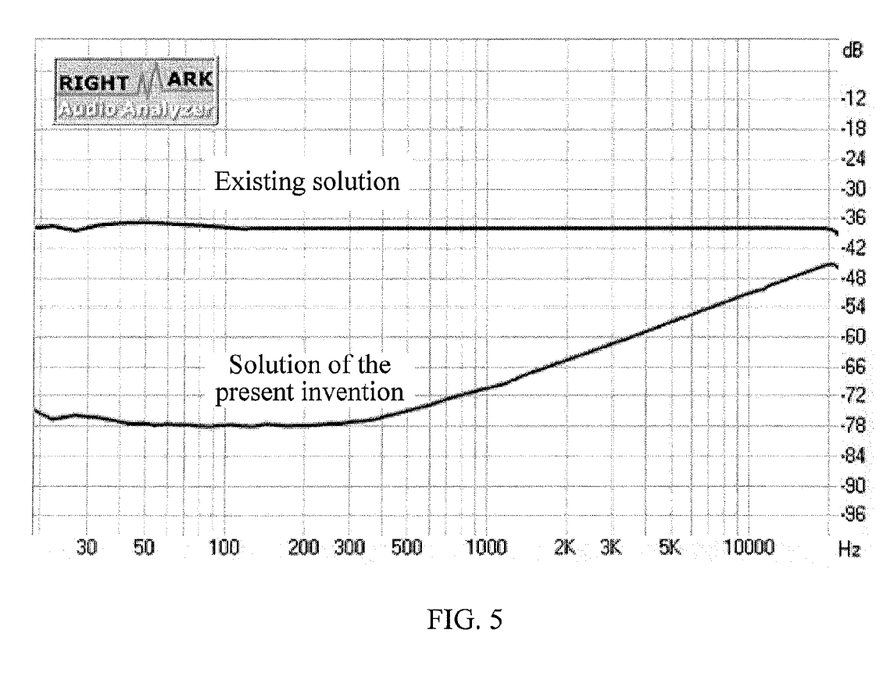
FIG. 5 shows a curve contrast of stereo crosstalk indexes between a solution provided in the present disclosure and the prior art.

Furthermore, a curve contrast of stereo crosstalk indexes between the solution provided in the present disclosure and the prior art is as shown in FIG. 5.

In combination with the earphone power amplifier shown in FIG. 2, a working method of the earphone power amplifier may include:

receiving, by a first ferrite bead FB1, signals fed back from a left sound channel and a right sound channel of an earphone, and sending the fed back signals as a first positive feedback signal and a second positive feedback signal to an in-phase input end of a first operational amplifier and an in-phase input end of a second operational amplifier respectively;

performing, by the first operational amplifier, amplifying operation processing on received positive and negative input signals and the received first positive feedback signal of the left sound channel, and then outputting a left sound channel signal to the left sound channel of the earphone; and performing, by the second operational amplifier, amplifying operation processing on received positive and negative input signals and the received second positive feedback signal of the right sound channel, and then outputting a right sound channel signal to the right sound channel of the earphone.

In this embodiment, the foregoing working method is a cyclic process. The step of receiving, by the first ferrite bead FB1, the signals fed back from the left sound channel and the right sound channel of the earphone, and sending the fed back signals as the first positive feedback signal and the second positive feedback signal to the in-phase input end of the first operational amplifier and the in-phase input end of the second operational amplifier respectively may be executed continuously after the foregoing step of performing, by the first operational amplifier, the amplifying operation processing on the received positive and negative input signals and the received first positive feedback signal of the left sound channel, and then outputting the left sound channel signal to the left sound channel of the earphone and the step of performing, by the second operational amplifier, the amplifying operation processing on the received positive and negative input signals and the received second positive feedback signal of the right sound channel, and then outputting the right sound channel signal to the right sound channel of the earphone.

In this embodiment, the step of performing, by the first operational amplifier, the amplifying operation processing on the positive and negative input signals and the first positive feedback signal of the left sound channel, and then outputting the left sound channel signal to the left sound channel of the earphone may include:

performing, by the first operational amplifier of a left sound channel power amplifying circuit, amplifying operation processing according to an input signal (LP) input to the in-phase input end, an input signal (LN) input to an anti-phase input end, and the first positive feedback signal (REF) input to the in-phase input end, and outputting a left sound channel signal to the left sound channel of the earphone.

In this embodiment, the step of performing, by the second operational amplifier, the amplifying operation processing on the positive and negative input signals and the second positive feedback signal of the right sound channel, and then outputting the right sound channel signal to the right sound channel of the earphone may include:

performing, by the second operational amplifier of a right sound channel power amplifying circuit, amplifying operation processing according to an input signal (RP) input to the in-phase input end, an input signal (RN) input to an anti-phase input end, and the second positive feedback signal (REF) input to the in-phase input end, and outputting a right sound channel signal to the right sound channel of the earphone.

In combination with the earphone power amplifier shown in FIG. 4, the working method of the earphone power amplifier may further include: performing filtering on the signals fed back from the left sound channel of the earphone and the right sound channel of the earphone. Correspondingly, the step of sending the fed back signals as the first positive feedback signal and the second positive feedback signal to the in-phase input end of the first operational amplifier and the in-phase input end of the second operational amplifier respectively changes into: sending the filtered signals as the first positive feedback signal and the second positive feedback signal to the in-phase input end of the first operational amplifier and the in-phase input end of the second operational amplifier respectively.

Specifically, the filtering the signals fed back from the left sound channel of the earphone and the right sound channel of the earphone may specifically be: sending the signals fed back from the left sound channel of the earphone and the right sound channel of the earphone to the filter for filtering after passing a fourth ferrite bead FB4.

Figure 6:
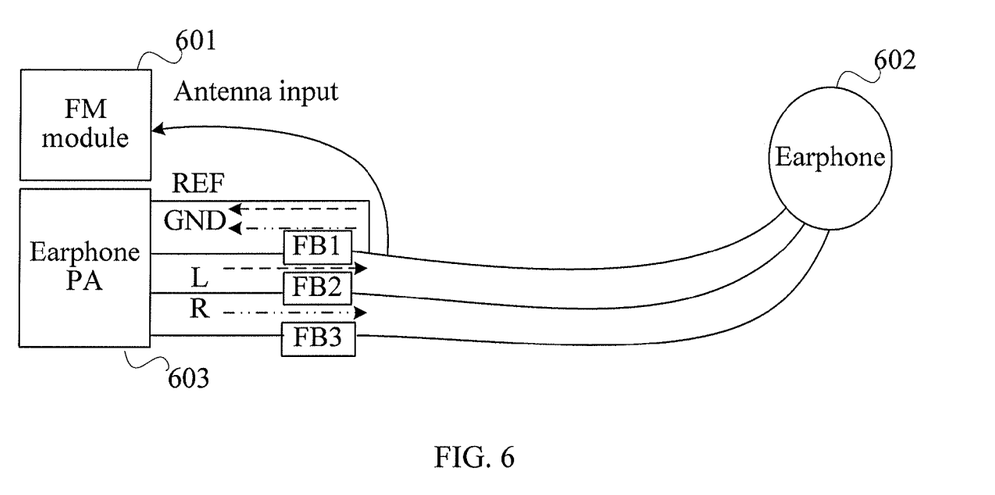
FIG. 6 is a schematic structural diagram of a mobile terminal equipment according to a third embodiment of the present disclosure.

On the basis of the foregoing embodiments, FIG. 6 is a schematic structural diagram of a mobile terminal equipment according to a third embodiment of the present disclosure. As shown in FIG. 6, the mobile terminal equipment at least includes an FM device 601, an earphone 602, and an earphone power amplifier 603. The earphone 602 is configured to provide an antenna for the FM device 601, and the earphone power amplifier 603 may be as described in the foregoing embodiments, which is not repeatedly described here.

Finally, it should be noted that the foregoing embodiments are merely provided for describing the solutions of the present disclosure, but not intended to limit the present disclosure. Although the present disclosure is described in detail with reference to the foregoing embodiments, persons of ordinary skill in the art should understand that they may still make modifications to the solutions described in the foregoing embodiments, or equivalent replacements to part or all of the features in the solutions; however, these modifications or replacements do not make the essence of corresponding solutions depart from the scope of the solutions of the embodiments of the present disclosure.

What is claimed is:

1. An earphone power amplifier, comprising a ground contact connected to a ground wire of an earphone, a left sound channel power amplifying circuit connected to a left sound channel of the earphone, and a right sound channel power amplifying circuit connected to a right sound channel of the earphone, wherein the left sound channel power amplifying circuit comprises a first operational amplifier, the right sound channel power amplifying circuit comprises a second operational amplifier; and the ground contact is serially connected to a first ferrite bead;

the left sound channel power amplifying circuit further comprises a first positive feedback exported from an input end of the first ferrite bead to an in-phase input end of the first operational amplifier, wherein the first positive feedback exported from the input end of the first ferrite bead is imported to the in-phase input end of the first operational amplifier through a resistor; and the right sound channel power amplifying circuit further comprises a second positive feedback exported from the input end of the first ferrite bead to an in-phase input end of the second operational amplifier, wherein the second positive feedback exported from the input end of the first ferrite bead is imported to an the in-phase input end of the second operational amplifier through a resistor;

wherein the power amplifier further comprises a filter, an input end of the filter is connected to the input end of the first ferrite bead, and the filter is a resistor-capacitor RC low pass filter formed of a resistor of 120 ohm and a capacitor of 22 nF.

2. The earphone power amplifier according to claim 1, wherein: the first positive feedback is exported from an output end of the filter to the in-phase input end of the first operational amplifier, and the second positive feedback is exported from the output end of the filter to the in-phase input end of the second operational amplifier.

3. The earphone power amplifier according to claim 2, wherein between the input end of the filter and the first ferrite bead is serially connected to a fourth ferrite bead.

4. The earphone power amplifier according to claim 1, wherein an output end of the first operational amplifier is serially connected to a second ferrite bead, an output end of the second operational amplifier is serially connected to a third ferrite bead; and one or multiple of the first ferrite bead, the second ferrite bead, the third ferrite bead, and a fourth ferrite bead are radio frequency ferrite beads.

5. A mobile terminal equipment, comprising a frequency modulation (FM) device, an earphone, and an earphone power amplifier, wherein:

the earphone is configured to provide an antenna for the FM device; and the earphone power amplifier comprises a ground contact connected to a ground wire of an earphone, a left sound channel power amplifying circuit connected to a left sound channel of the earphone, and a right sound channel power amplifying circuit connected to a right sound channel of the earphone, wherein the left sound channel power amplifying circuit comprises a first operational amplifier, the right sound channel power amplifying circuit comprises a second operational amplifier; and the ground contact is serially connected to a first ferrite bead;

the left sound channel power amplifying circuit further comprises a first positive feedback exported from an input end of the first ferrite bead to an in-phase input end of the first operational amplifier, wherein the first positive feedback exported from an the input end of the first ferrite bead is imported to an the in-phase input end of the first operational amplifier through a resistor;

the right sound channel power amplifying circuit further comprises a second positive feedback exported from the input end of the first ferrite bead to an in-phase input end of the second operational amplifier, wherein the second positive feedback exported from the input end of the first ferrite bead is imported to the in-phase input end of the second operational amplifier through a resistor; and wherein the power amplifier further comprises a filter, an input end of the filter is connected to the input end of the first ferrite bead, and the filter is a resistor-capacitor RC low pass filter formed of a resistor of 120 ohm and a capacitor of 22 nF.

6. The mobile terminal equipment according to claim 5, wherein the input end of the filter is serially connected to a fourth ferrite bead.

7. The mobile terminal equipment according to claim 5, wherein an output end of the first operational amplifier is serially connected to a second ferrite bead, an output end of the second operational amplifier is serially connected to a third ferrite bead; and at least one of the first ferrite bead, the second ferrite bead, the third ferrite bead, and the fourth ferrite bead are radio frequency ferrite beads.

* * * * *

UNITED STATES PATENT AND TRADEMARK OFFICE
CERTIFICATE OF CORRECTION

| | |
|---|---|
| PATENT NO. | : 8,755,544 B2 |
| APPLICATION NO. | : 13/648761 |
| DATED | : June 17, 2014 |
| INVENTOR(S) | : Haitao Zhen et al. |

It is certified that error appears in the above-identified patent and that said Letters Patent is hereby corrected as shown below:

<u>In the Claims</u>

In column 8, claim 1, line 59, after "is imported to" delete "an".

In column 10, claim 5, line 6, after "is imported to" delete "an".

Signed and Sealed this
Eleventh Day of November, 2014

Michelle K. Lee
*Deputy Director of the United States Patent and Trademark Office*